United States Patent
Hoffmeyer

(10) Patent No.: US 10,834,811 B2
(45) Date of Patent: Nov. 10, 2020

(54) IMPLEMENTING REWORKABLE STRAIN RELIEF PACKAGING STRUCTURE FOR ELECTRONIC COMPONENT INTERCONNECTS

(71) Applicant: International Business Machines Corporation, Armonk, NY (US)

(72) Inventor: Mark K. Hoffmeyer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 15/942,742

(22) Filed: Apr. 2, 2018

(65) Prior Publication Data
US 2018/0228022 A1 Aug. 9, 2018

Related U.S. Application Data

(62) Division of application No. 15/373,511, filed on Dec. 9, 2016, now Pat. No. 10,111,322.

(51) Int. Cl.
*B23K 1/00* (2006.01)
*H05K 1/02* (2006.01)
(Continued)

(52) U.S. Cl.
CPC ....... *H05K 1/0271* (2013.01); *H01L 21/4853* (2013.01); *H01L 21/563* (2013.01); *H01L 23/3142* (2013.01); *H01L 23/49838* (2013.01); *H01L 23/562* (2013.01); *H01L 24/32* (2013.01); *H01L 24/83* (2013.01); *H05K 1/181* (2013.01); *H05K 3/284* (2013.01); *H05K 3/303* (2013.01);
(Continued)

(58) Field of Classification Search
CPC .. B23K 1/018; B23K 2101/42; B23K 1/0008; B23K 1/012; B23K 20/007; B23K 35/3013; B23K 35/322; B23K 3/0638
See application file for complete search history.

(56) References Cited

U.S. PATENT DOCUMENTS 5,601,675 A * 2/1997 Hoffmeyer ............ H01L 24/32
156/94
5,659,203 A 8/1997 Call et al.
(Continued)

OTHER PUBLICATIONS

Menezes et al., "Large Low-CTE glass package-to-PCB interconnections with solder strain-relief using polymer collars", Proc. IEEE 64th ECTC Conference, pp. 1959-1964 (2014).
(Continued)

*Primary Examiner* — Erin B Saad
(74) *Attorney, Agent, or Firm* — Nathan M. Rau

(57) ABSTRACT

A method and structure are provided for implementing enhanced reworkable strain relief packaging for electronic component interconnects. A plurality of custom strain relief pads is provided with a component footprint wiring layout on a component carrier or a component. The custom strain relief pads are disposed at component body perimeter locations. A solder mask is applied around these pad locations to provide a constrained area for a fusible surface coating. A fusible surface coating material is applied in the to the custom strain relief pads in the constrained area and then soldering of components is performed. Then a structural adhesive material is applied to the custom strain relief pad locations.

11 Claims, 11 Drawing Sheets

(51) Int. Cl.
*H01L 23/00* (2006.01)
*H05K 3/40* (2006.01)
*H01L 21/48* (2006.01)
*H05K 3/34* (2006.01)
*H01L 21/56* (2006.01)
*H05K 3/28* (2006.01)
*H05K 1/18* (2006.01)
*H01L 23/498* (2006.01)
*H01L 23/31* (2006.01)
*H05K 3/30* (2006.01)
*H01L 23/538* (2006.01)

(52) U.S. Cl.
CPC ........... *H05K 3/341* (2013.01); *H05K 3/4007* (2013.01); *H01L 23/5386* (2013.01); *H01L 2224/32225* (2013.01); *H01L 2224/83192* (2013.01); *H01L 2224/83815* (2013.01); *H01L 2224/83948* (2013.01); *H01L 2924/1431* (2013.01); *H01L 2924/1432* (2013.01); *H01L 2924/1433* (2013.01); *H01L 2924/2021* (2013.01); *H05K 3/3436* (2013.01); *H05K 2201/09909* (2013.01)

(56) References Cited

U.S. PATENT DOCUMENTS

| | | | |
|---|---|---|---|
| 6,084,775 | A | 7/2000 | Bartley et al. |
| 7,342,306 | B2 | 3/2008 | Colbert et al. |
| 7,435,622 | B2 | 10/2008 | Colbert et al. |
| 10,111,322 | B2 * | 10/2018 | Hoffmeyer ........... H05K 1/0271 |
| 2005/0110158 | A1 | 5/2005 | Aoyagi |

OTHER PUBLICATIONS

List of IBM Patents or Patent Application Treated as Related, Signed Feb. 4, 2020, 2 pages.

\* cited by examiner

400

402    404

406    408

410    412

414    416

418    420

422

IMPLEMENTING REWORKABLE STRAIN RELIEF PACKAGING STRUCTURE FOR ELECTRONIC COMPONENT INTERCONNECTS

This application is a divisional application of Ser. No. 15/373,511 filed Dec. 9, 2016.

FIELD OF THE INVENTION

The present invention relates generally to the data processing field, and more particularly, relates to a method and structure for implementing enhanced reworkable strain relief packaging for electronic component interconnects.

DESCRIPTION OF THE RELATED ART

Ever increasing electronic packaging density within computer systems and industry standard drawer formats typically drives less room for mechanical support within system frames, systems drawers, and Central Computer Electronics (CEC) chassis designs. As a result, electrical interconnects within these systems possess less structural support and are at greater risk for mechanical damage driven from shock and vibration or other mechanical strain events that arise during electronic card test operations, systems integration operations, system shipping, data center moves, repair, replacement or upgrade actions, and/or during overall in-service operation through time. The scope of strain induced damage on interconnects typically results in cracked, separated, cratered solder joint interconnects, or cracked copper wiring terminations a solder joint pads, which then drive intermittent or open joint conditions and latent system field failures.

When sufficient structural support cannot be provided in a system or board design, a simple way to provide solder joint strain relief and/or strain reduction on components is to incorporate the use of a commercially available structural "edgebond" or "cornerbond" underfill adhesive. These types of adhesives are designed to be applied to perimeter locations of component bodies and bond the edges of component bodies to the mounting substrate or circuit board. Unlike full underfill adhesives, these materials are much easier to apply, and have short cure times. In addition, these materials are designed to have restricted flow, and fill and bond only to component edges and a very small distance (1 mm or less) under the bottom edges of components. When fully cured, these structural adhesives provide outrigger supports on components and provide strain reduction on component solder joints by either moving high strain fields outside of the component footprint or by simply reinforcing strength of the overall package structure in the presence of high strains and strain rates. Typical "Edgebond" or "Cornerbond" adhesives are heat cured or UV cured epoxy base materials that are filled with inorganic particles to tailor expansion properties and materials strength properties. Examples of commercially available strain relief materials include products by Zymet of East Hanover, N.J., Zymet UA2605B (heat cure) and Dymax Corporation of Torrington, Conn., Dymax 9309SC (UV cure).

The main problem faced by using edge bond and corner bond materials is that once applied and cured, component rework is not enabled. Some materials are claimed to be reworkable by their manufacturer, by allowing the component to be removed from the board surface when heat is applied, but significant post component removal cleanup of residual bonding material must be provided, making the rework process untenable from yield, cycle time and overall cost perspectives. In some applications, this can result in a very significant manufacturing cost increase, especially if custom application specific integrated circuits (ASICs) such as state of the art field programmable gate array (FPGA) module packages or CPU modules and sockets require rework, or if other connector or module types require rework on high asset value, complex board constructions.

A need exists for a method and structure for implementing enhanced reworkable strain relief packaging for electronic component interconnects.

As used in the following description and claims, the term component carrier should be understood to broadly include a printed wiring board (PWB), a printed circuit board (PCB), circuit carrier, and other substrates including an interconnect substrate, and various substrates suitable for the mounting of electronic components.

SUMMARY OF THE INVENTION

Principal aspects of the present invention are to provide a method and structure for implementing enhanced reworkable strain relief packaging for electronic component interconnects. Other important aspects of the present invention are to provide such method and structure substantially without negative effects and that overcome many of the disadvantages of prior art arrangements.

In brief, a method and structure are provided for implementing enhanced reworkable strain relief packaging for electronic component interconnects. A plurality of custom strain relief pads is provided with a component footprint wiring layout on a component carrier. The custom strain relief pads are disposed at component body perimeter locations. A solder mask is applied around these pad locations to provide a constrained area for a fusible surface coating. A fusible surface coating material is applied in the to the custom strain relief pads in the constrained area and then soldering of components is performed. Then a structural adhesive material is applied to the custom strain relief pad locations.

In accordance with features of the invention, the custom strain relief pads are disposed at component body perimeter locations, such as at array type component corners or array type component edge locations.

In accordance with features of the invention, the fusible surface coating includes a selected one of solder, other low melt metal, and metal alloy composition.

In accordance with features of the invention, the solder mask applied around the custom strain relief pad locations provides structural adhesive strain relief material wells.

In accordance with features of the invention, the fusible surface coating material is applied via a selected method including one of paste deposition, wave soldering, hot air solder leveling, plating, and other physical and chemical deposition method including one of vapor deposition, and sputtering.

In accordance with features of the invention, the soldering of components is performed using, for example, a selected one of a surface mount technology (SMT) component-to-board assembly method and solder reflow method.

In accordance with features of the invention, the structural adhesive material includes adhesive strain relief materials, such as Zymet UA2605B (heat cure) and Dymax 9309SC (UV cure).

In accordance with features of the invention, the custom strain relief pads having strain relief adhesive material dispensed thereon are designed to reside partially outside a component body perimeter and partially underneath a component body to accommodate optimized fillet formation of the strain relief adhesive to the custom coated pad surfaces, to the bottom surface face of the component perimeter, and to the vertical sidewalls of the component perimeter.

In accordance with features of the invention, the fusible layer has a composition which is designed to melt at or below a melting temperature of the component solder joints. Local heat is applied to a particular component using conventional rework tools. As a result, melting and liquid layer formation beneath the structural strain relief adhesive provides de-bonding, and an easy, clean separation and removal of the component and the strain relief adhesive from the fusible release layer coating present on the custom strain relief pads.

In accordance with features of the invention, the novel packaging structure enables easy component removal and subsequent site rework and component replacement to be realized when a rigid structural adhesive is used on component corners or edges to ruggedize an assembly and provide component strain relief.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structure are provided for implementing enhanced reworkable strain relief packaging for electronic component interconnects. A plurality of custom strain relief pads is provided with a component footprint wiring layout on a component carrier. The custom strain relief pads are disposed at component body perimeter locations. A solder mask is applied around these pad locations to provide a constrained area for a fusible surface coating. A fusible surface coating material is applied in the to the custom strain relief pads in the constrained area and then soldering of components is performed. Then a structural adhesive material is applied to the custom strain relief pad locations.

In accordance with features of the invention, a method and structure are provided for implementing enhanced reworkable strain relief packaging providing solder ball wear out stress relief. The enhanced reworkable strain relief packaging structure for electronic component interconnects enables applying local heat for component removal, rework and replacement when required due to functional or damage issues, the fusible layer has a composition which is designed to melt at or below the melting temperature of the solder joints, providing an easy, clean separation of the component and the strain relief adhesive from the fusible release layer.

Figure 1A:
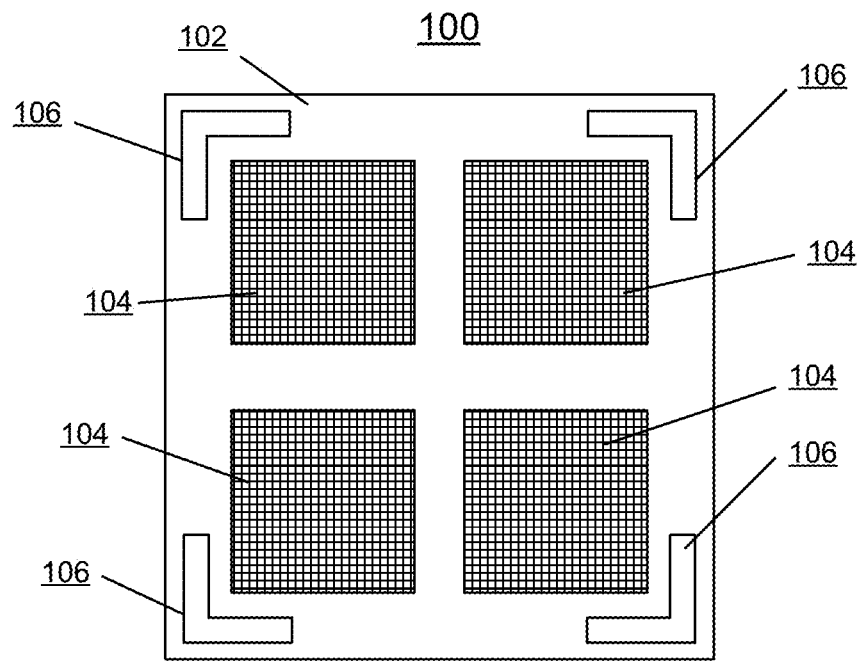
FIGS. 1A and 1B, and FIGS. 1C and 1D are respective top and side views illustrating example structures for implementing enhanced reworkable strain relief packaging for electronic component interconnects in accordance with the preferred embodiments.
Figure 1B:
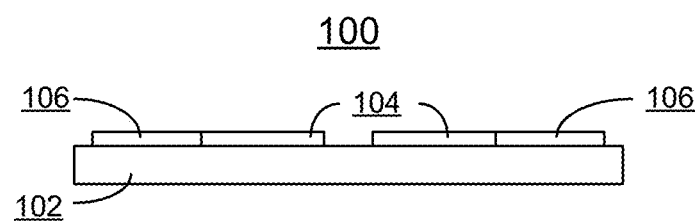
Figure 1C:
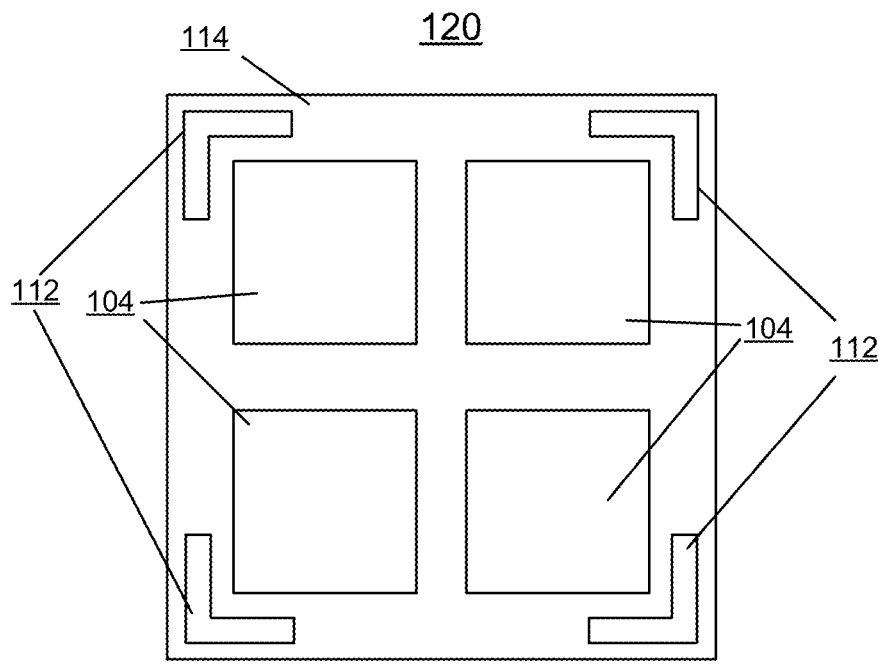
Figure 1D:
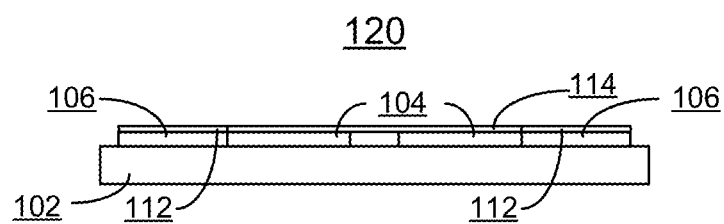
Figure 2A:
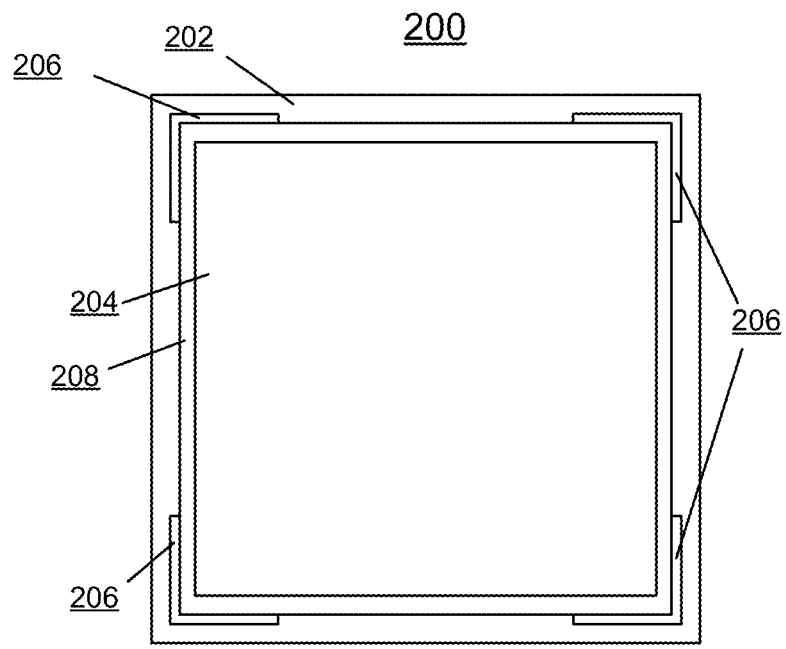
FIGS. 2A and 2B and FIGS. 2C and 2D are respective top and side views illustrating example structures for implementing enhanced reworkable strain relief packaging for electronic component interconnects in accordance with the preferred embodiments.
Figure 2B:
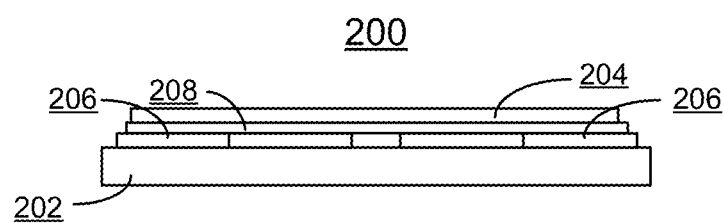
Figure 2C:
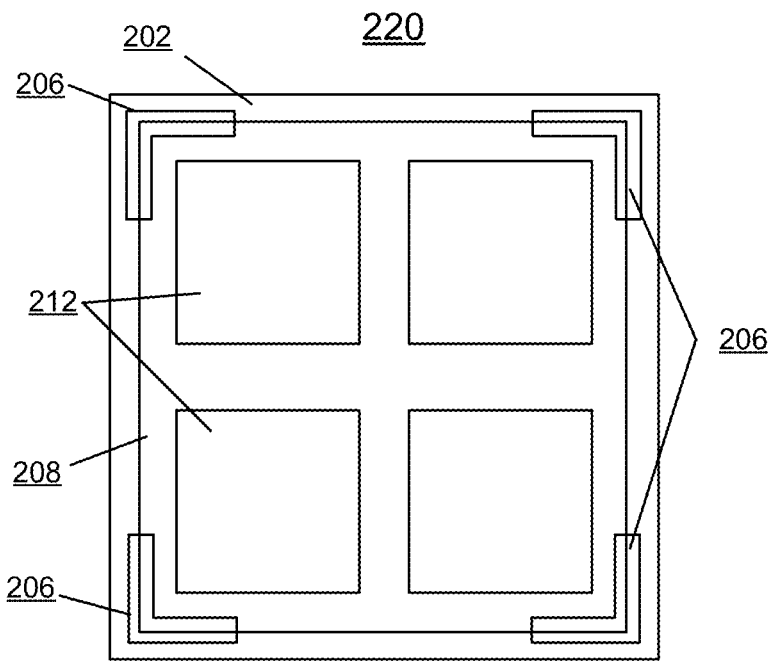
Figure 2D:
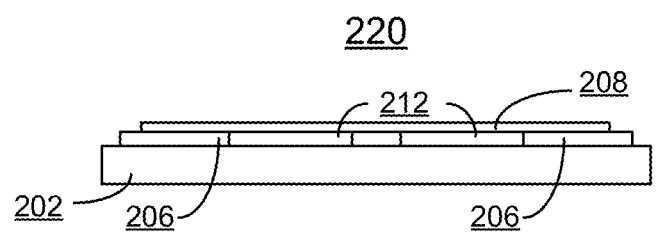

Having reference now to the drawings, in 1A and 1B, and FIGS. 1C and 1D, there are shown example structures generally designated by reference characters 100, 120 for implementing enhanced reworkable strain relief packaging for electronic component interconnects in accordance with the preferred embodiment. Structures 100, 120 include a printed wiring board (PWB) 102 with an example footprint 104 of ball grid array (BGA) modules or connector components with a plurality of custom corner or edge pads 106 shown on PWB 102. In FIGS. 1C and 1D, the structure 120 includes a fusible layer 112 extending above and covering the custom corner or edge pads 106, and a fusible layer 114 extending around the custom corner or edge pads 106 in the example footprint 104.

In accordance with features of the invention, the fusible layer 112, 114 has a composition which is designed to melt at or below a melting temperature of the component solder joints. Local heat is applied to a particular component using conventional rework tools. As a result, melting and liquid layer formation beneath the structural strain relief adhesive provides de-bonding, and an easy, clean separation and removal of the component and the strain relief adhesive from the fusible release layer coating present on the custom strain relief pads.

In accordance with features of the invention, the novel packaging structures 100, 120 enable easy component removal and subsequent site rework and component replacement to be realized when a rigid structural adhesive is used on component corners or edges to ruggedize an assembly and provide component strain relief.

Referring now to FIGS. 2A and 2B and FIGS. 2C and 2D, there are shown respective top and side views illustrating example structures generally designated by reference char200, 220 for implementing enhanced reworkable strain relief packaging for electronic component interconnects in accordance with the preferred embodiments. Structure 200 includes a printed wiring board (PWB) 202 with an example overmolded organic ball grid array (BGA) module 204 solder attached to PWB component site with a plurality of custom corner or edge pads 206 on PWB 202 and below a component laminate 208. In FIGS. 1C and 1D, the structure 220 includes a printed wiring board (PWB) 202 with an example HLGA connectors 212 solder attached to PWB component site with a plurality of custom corner or edge pads 206 on PWB 202 and below a component laminate 208.

Figure 3A:
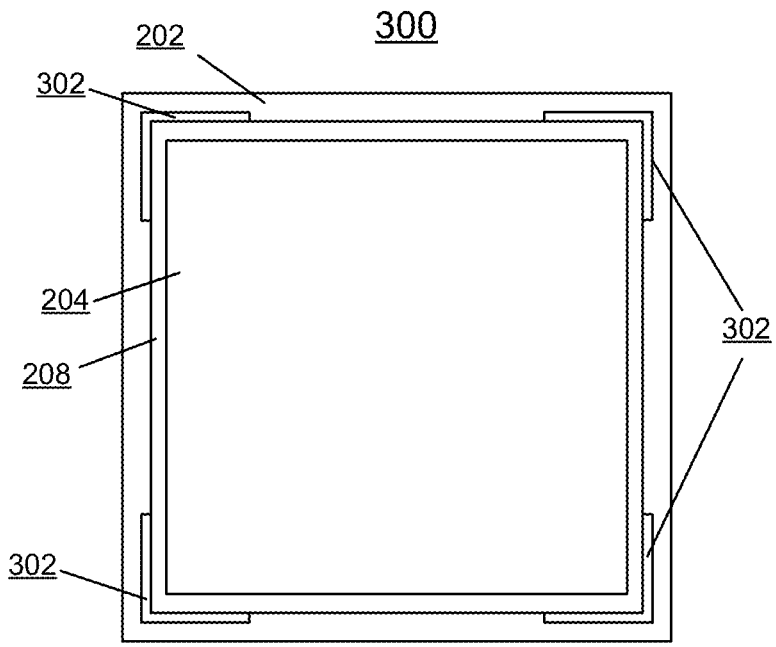
FIGS. 3A and 3B and FIGS. 3C and 3D are respective top and side views illustrating example structures for implementing enhanced reworkable strain relief packaging for electronic component interconnects in accordance with the preferred embodiments.
Figure 3B:
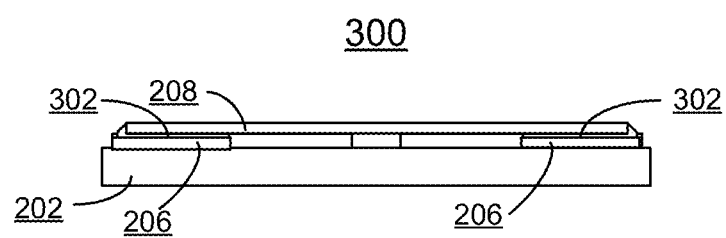
Figure 3C:
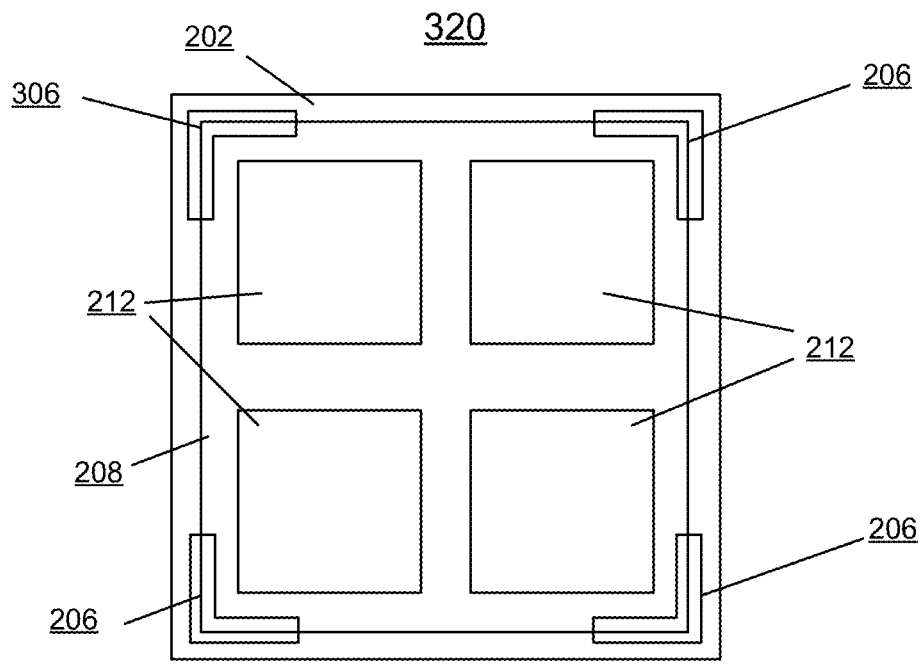
Figure 3D:
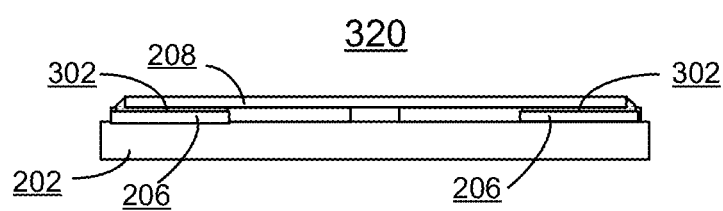

Referring now to FIGS. 3A and 3B and FIGS. 3C and 3D, there are shown respective top and side views illustrating example structures generally designated by reference characters 300, 320 for implementing enhanced reworkable strain relief packaging for electronic component interconnects in accordance with the preferred embodiments. Structures 300, 320 illustrate structures 200, 220 including an additional fusible layer 302 extending above and covering the custom corner or edge pads 206, of structures 200, 220 in accordance with features of the invention. The additional fusible layer 302 extending above and covering the custom corner or edge pads 206 are best seen in FIGS. 3B, and 3D.

Figure 4A:
FIGS. 4A and 4B illustrate example package structures and process sequence for implementing enhanced reworkable strain relief packaging for electronic component interconnects in accordance with the preferred embodiments.
Figure 4A:
Figure 4A:
Figure 4A:
Figure 4A:
Figure 4A:
Figure 4A:
Figure 4A:
Figure 4A:
Figure 4A:
Figure 4A:
Figure 4A:
Figure 4A:
Figure 4A:
Figure 4A:
Figure 4A:
Figure 4B:
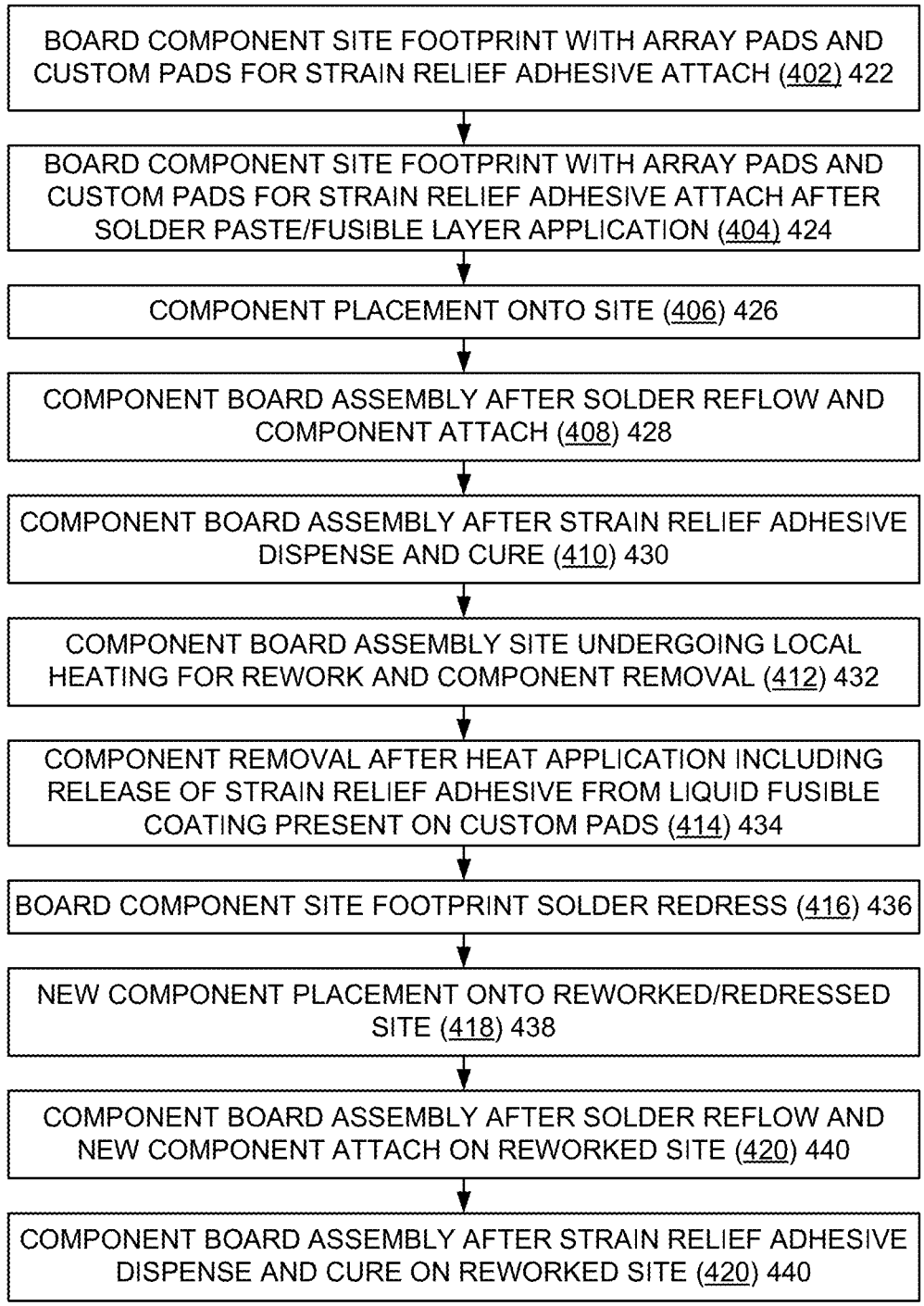

FIGS. 4A and 4B respectively schematically illustrate example package structures generally designated by reference characters 400, and process sequence steps for implementing enhanced reworkable strain relief packaging for electronic component interconnects in accordance with the preferred embodiments.

Referring now to FIG. 4A and FIG. 4B, package structures are shown in FIG. 4A, and in FIG. 4B, there is shown a flow chart illustrating example process sequence steps corresponding to the package structures of FIG. 4A. In FIG. 4A, structure 402 illustrates a board component site footprint with array pads and custom pads for strain relief adhesive attach, and structure 404 illustrates the board component site footprint after solder paste and fusible layer applications the board component site footprint, as indicated at blocks 422 and 424 in FIG. 4B. Structure 406 illustrates a component placement onto the site and as indicated at block 426. Structure 408 illustrates component board assembly after solder reflow and component attach and as indicated at block 428. Structure 410 illustrates component board assembly after strain relief adhesive dispense and cure and as indicated at block 430. Structure 412 illustrates component board assembly site undergoing local heating for rework and component removal and as indicated at block 432. Structure 414 illustrates component removal after heat application including release of strain relief adhesive from liquid fusible coat present on custom pads and as indicated at block 434. Structure 416 illustrates board component site footprint solder redress and as indicated at block 436. Structure 418 illustrates new component placement onto reworked/redressed site and as indicated at block 438. Structure 420 illustrates component board assembly after solder reflow and component attach on the reworked site and as indicated at block 440. Structure 422 illustrates new component assembly after strain relief adhesive dispense and cure on the reworked site and as indicated at block 440.

Figure 5A:
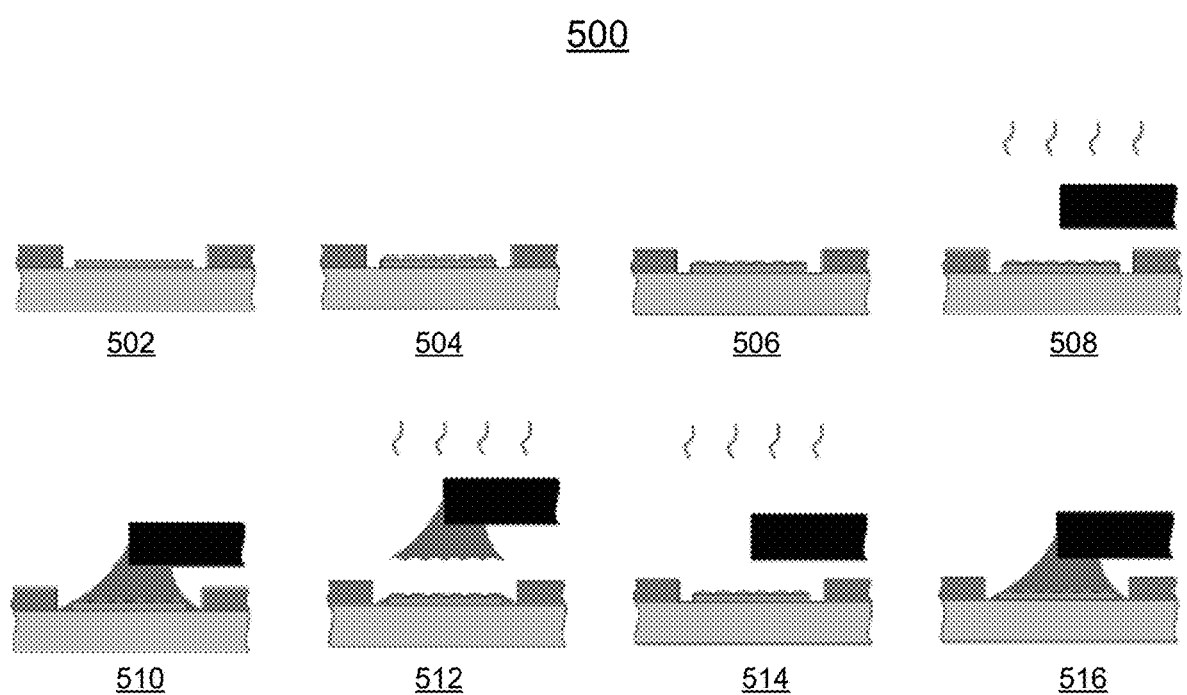
FIGS. 5A and 5B illustrate example package structures and process sequence for implementing enhanced reworkable strain relief packaging for electronic component interconnects in accordance with the preferred embodiments.
Figure 5B:
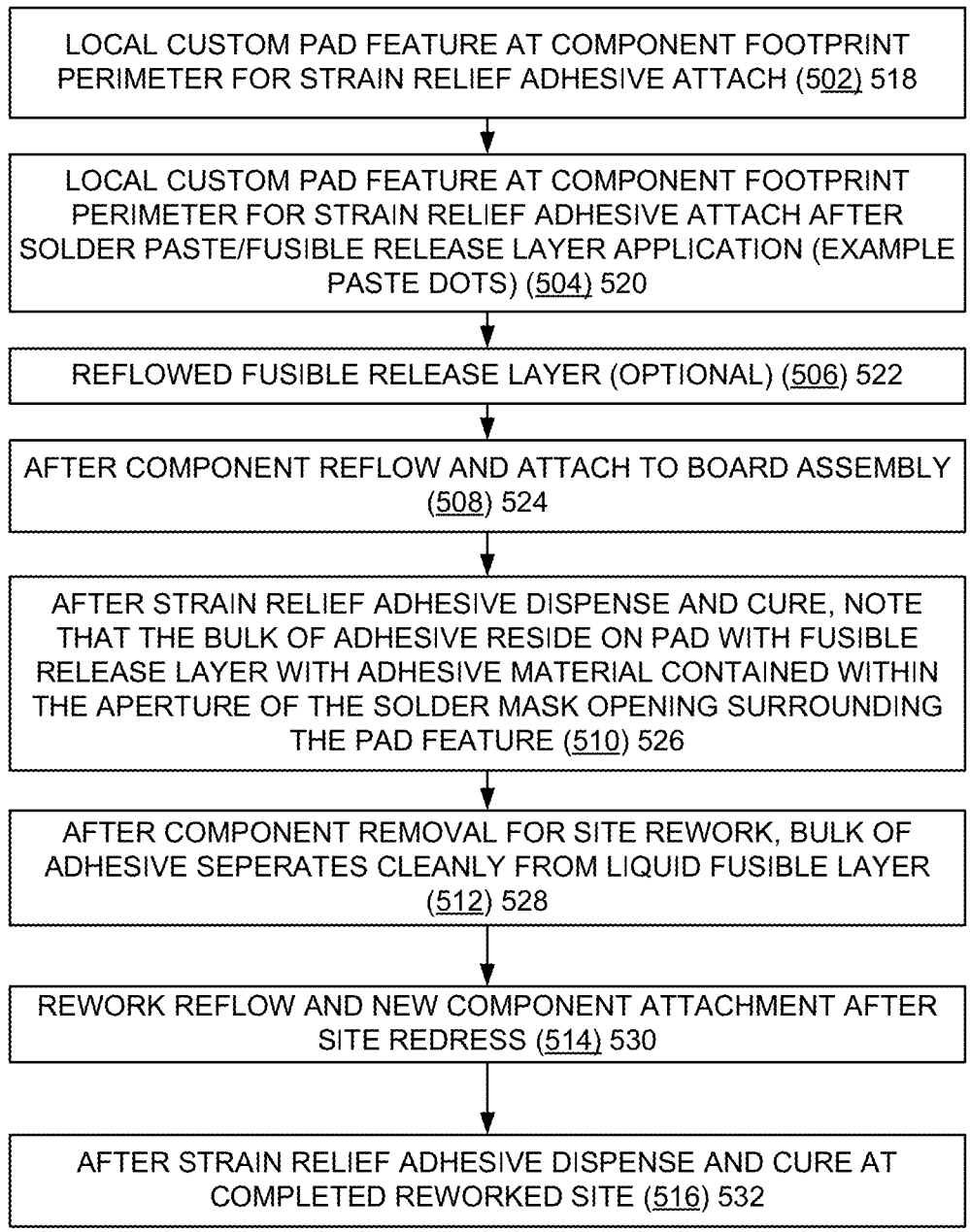

FIGS. 5A and 5B respectively schematically illustrate example package structures generally designated by reference characters 400, and process sequence steps for implementing enhanced reworkable strain relief packaging for electronic component interconnects in accordance with the preferred embodiments.

Referring now to FIG. 5A and FIG. 5B, in FIG. 5A package structures are shown with high magnification of the custom pad area 106, 206, and in FIG. 5B, there is shown a flow chart illustrating example process sequence steps corresponding to the package structures of FIG. 5A. In FIG. 5A, structure 502 illustrates a local custom pad feature at component footprint perimeter for strain relief adhesive attach, and as indicated at block 518. Structure 504 illustrates the local custom pad feature at component footprint perimeter for strain relief adhesive attach after solder paste and fusible layer application, as indicated at a block 520. Structure 506 illustrates an optional reflowed fusible release layer as indicated at block 522. Structure 508 illustrates component board assembly after solder reflow and component attach and as indicated at block 524. Structure 510 illustrates component board assembly after component solder reflow and attach to board assembly and after strain relief adhesive dispense and cure as indicated at block 524. Note in structure 510 that the bulk of adhesive fillet resides on pad with adhesive material contained within the aperture of the solder mask opening surrounding the pad feature. Structure 512 illustrates component board assembly site after component removal for site rework after undergoing local heating for rework and component removal and bulk of the adhesive separates cleanly for the liquid fusible layer as indicated at block 528. Structure 514 illustrates rework, reflow and new component attachment after site redress as indicated at block 530. Structure 516 illustrates new component assembly after strain relief adhesive dispense and cure on the completed reworked site as indicated at block 534.

Figure 6:
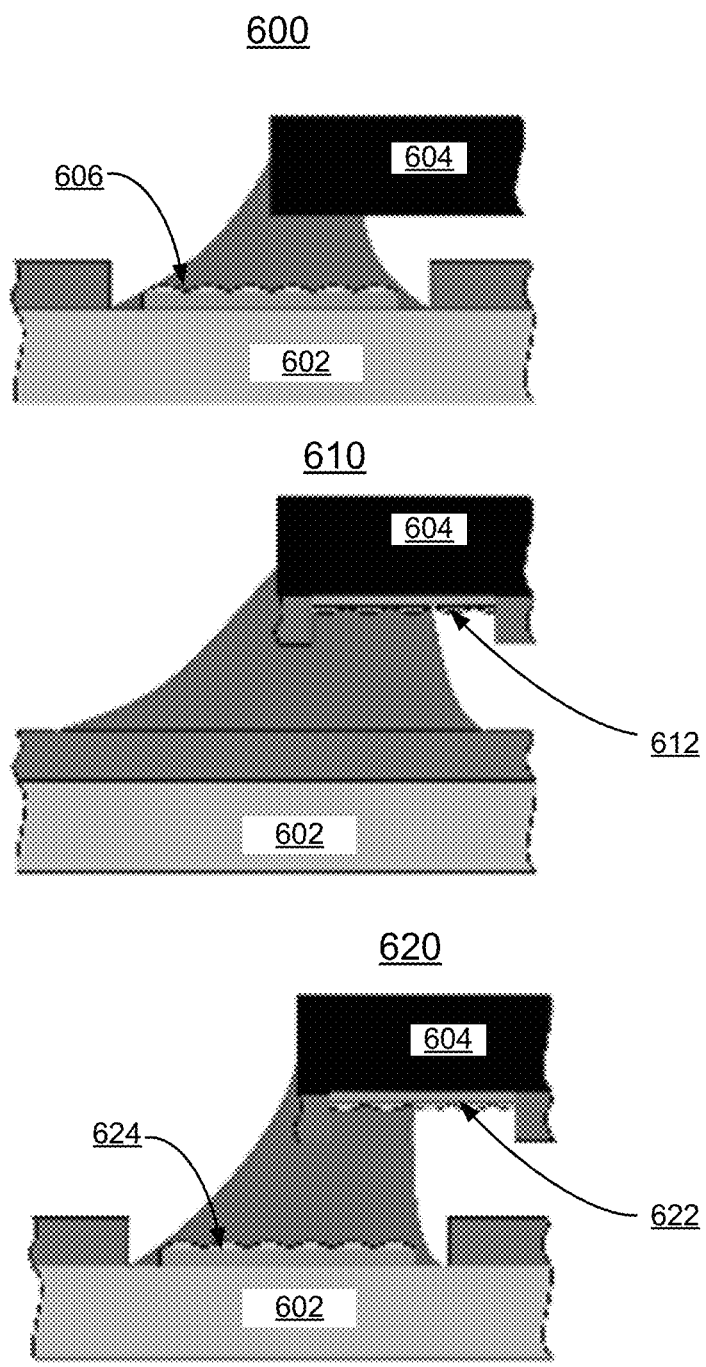
FIG. 6 illustrates example package structures for implementing enhanced reworkable strain relief packaging for electronic component interconnects in accordance with preferred embodiments of the invention.

Referring now to FIG. 6, there are shown package structures with high magnification of custom pad areas generally designated by reference characters 600, 610, and 620 in accordance with preferred embodiments of the invention. Each of the structures 600, 610, and 620 includes a component carrier 602, such as a printed wiring board (PWB) 602, and a component 604, such as a Ball Grid Array (BGA) component 604.

In structure 600, pad features and fusible release layer 606 are provided on the PWB 602, such as illustrated and described above. In structure 610, custom pad features and fusible release layer 612 is provided on the BGA 604. The custom pad features 612 advantageously are provided on the bottom body perimeter of the BGA component 604 surrounding the array of solder attach balls, and are coated with similar release layers of fusible materials described above. The custom pad features and fusible release layer 612 are provided on the BGA 604 facilitate easily reworking the component as well by allowing for easy removal of the structural strain relief adhesive from the surface of the BGA component 604. In structure 620, custom pad features and fusible release layer 612 are provided on the BGA 604 as described with respect to structure 610, and custom pad features and fusible release layer 624 are provided on the PWB 602, as described above.

While the present invention has been described with reference to the details of the embodiments of the invention shown in the drawing, these details are not intended to limit the scope of the invention as claimed in the appended claims.

What is claimed is:
1. A method for implementing enhanced reworkable strain relief packaging for electronic component interconnects, the method comprising:
 providing a component carrier;
 providing, on the component carrier, a ball grid array (BGA) module footprint and further providing, at corner locations corresponding to corners of a placed BGA component, a plurality of first custom corner pads, the

BGA module footprint positioned within the plurality of first custom corner pads;

providing, on the BGA component, at locations corresponding to the corner locations, a plurality of second custom corner pads;

applying a solder mask around the plurality of first custom corner pads and around the plurality of second custom corner pads, the solder mask providing a first constrained area and a second constrained area, respectively;

depositing a fusible layer onto the plurality of first and the plurality of second custom corner pads, the fusible layer selected to have a melting temperature less than a melting temperature of solder used in BGA component solder joints formed between the BGA component and the component carrier;

placing a solder paste onto BGA ball attach pads included in the BGA module footprint;

placing the BGA component onto the component carrier so that solder attach balls of the BGA component contact the solder paste on the BGA ball attach pads;

soldering the BGA component to the component carrier; and depositing a structural adhesive material onto the plurality of first and onto the plurality of second custom corner pads.

2. The method of claim 1, further comprising:
applying local heating to the BGA component;
removing the BGA component for rework; and
removing the deposited structural adhesive material with local heating.

3. The method of claim 1 wherein providing the component carrier includes providing a printed circuit board (PCB) configured to accept the mounting of the BGA component.

4. The method of claim 1 wherein providing the component carrier includes providing a circuit carrier configured to accept the mounting of the BGA component.

5. The method of claim 1 wherein placing the BGA component on the component carrier and soldering the component to the BGA component carrier includes a solder reflow operation.

6. The method of claim 1 wherein placing the BGA component on the component carrier and soldering the component to the component carrier includes a surface-mount technology (SMT) assembly operation.

7. The method of claim 1 wherein depositing the structural adhesive material onto the plurality of first and onto the plurality of second custom corner pads includes an ultraviolet (UV) curing operation.

8. The method of claim 1 wherein depositing the structural adhesive material onto the plurality of first and onto the plurality of second custom corner pads includes a heat curing operation.

9. The method of claim 1, further comprising removing, by a local heating operation, the BGA component and the structural adhesive material deposited onto the plurality of first and onto the plurality of second custom corner pads.

10. The method of claim 9 wherein the structural adhesive material ruggedizes and provides strain relief for the BGA component and for component solder joints.

11. A method for implementing enhanced reworkable strain relief packaging for electronic component interconnects, the method comprising:

providing a BGA component;

providing a component carrier;

providing, at corner locations corresponding to corners of a placed BGA component on the component carrier, a plurality of first custom corner pads, and further providing on the component carrier, a ball grid array (BGA) module footprint, the BGA module footprint positioned within the plurality of first custom corner pads;

providing, at locations on the BGA component corresponding to the corner locations, a plurality of second custom corner pads;

applying a solder mask around the plurality of first custom corner pads and around the plurality of second custom corner pads, the solder mask providing a first constrained area and a second constrained area, respectively;

depositing a fusible layer onto the plurality of first and the plurality of second custom corner pads, the fusible layer selected to have a melting temperature less than a melting temperature of solder used in BGA component solder joints formed between the BGA component and the component carrier;

placing a solder paste onto BGA ball attach pads included in the BGA module footprint;

placing the BGA component onto the component carrier so that solder attach balls of the BGA component contact the solder paste on the BGA ball attach pads;

soldering the BGA component to the component carrier; and depositing a structural adhesive material onto the plurality of first and onto the plurality of second custom corner pads.

* * * * *